United States Patent
Ogata et al.

(10) Patent No.: US 8,749,041 B2
(45) Date of Patent: *Jun. 10, 2014

(54) THEE-DIMENSIONAL INTEGRATED SEMICONDUCTOR DEVICE AND METHOD FOR MANUFACTURING SAME

(75) Inventors: Yoshiharu Ogata, Sakata (JP); Tadashi Aizawa, Suwa (JP); Takeo Kitazawa, Azumino (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/782,749

(22) Filed: May 19, 2010

(65) Prior Publication Data

US 2010/0230827 A1 Sep. 16, 2010

Related U.S. Application Data

(62) Division of application No. 11/839,712, filed on Aug. 16, 2007, now abandoned.

(30) Foreign Application Priority Data

Feb. 21, 2006 (JP) ................................ 2006-043270

(51) Int. Cl.
 *H01L 23/02* (2006.01)
(52) U.S. Cl.
 USPC .......................................... 257/686; 438/106
(58) Field of Classification Search
 USPC .......................................... 257/686; 438/106
 See application file for complete search history.

(56) References Cited

U.S. PATENT DOCUMENTS

| | | | |
|---|---|---|---|
| 6,593,662 B1* | 7/2003 | Pu et al. ......................... | 257/777 |
| 6,765,299 B2 | 7/2004 | Takahashi et al. | |
| 7,354,800 B2 | 4/2008 | Carson | |
| 7,364,946 B2 | 4/2008 | Karnezos | |
| 7,504,717 B2* | 3/2009 | Kuroda et al. ................. | 257/686 |
| 2001/0013643 A1 | 8/2001 | Nakanishi et al. | |
| 2002/0175421 A1* | 11/2002 | Kimura ......................... | 257/778 |
| 2002/0185743 A1* | 12/2002 | Gil Baik ....................... | 257/777 |
| 2004/0124539 A1* | 7/2004 | Yang et al. .................... | 257/777 |
| 2004/0212064 A1* | 10/2004 | Wang ............................ | 257/685 |
| 2004/0212096 A1* | 10/2004 | Wang ............................ | 257/777 |
| 2005/0189140 A1 | 9/2005 | Tseng | |
| 2006/0102992 A1 | 5/2006 | Kwon et al. | |
| 2006/0139893 A1* | 6/2006 | Yoshimura et al. ........... | 361/735 |
| 2006/0186524 A1 | 8/2006 | Aiba et al. | |
| 2006/0197206 A1* | 9/2006 | Kim et al. ..................... | 257/686 |
| 2007/0072339 A1 | 3/2007 | Chen et al. | |
| 2007/0278646 A1 | 12/2007 | Ogata | |
| 2008/0174001 A1 | 7/2008 | Aiba et al. | |

FOREIGN PATENT DOCUMENTS

| | | |
|---|---|---|
| JP | 2000-269411 | 9/2000 |
| JP | 2004-296897 | 10/2004 |
| JP | 2004-303992 | 10/2004 |
| JP | 2005-017197 | 1/2005 |

(Continued)

*Primary Examiner* — Thao X Le
*Assistant Examiner* — Geoffrey Ida
(74) *Attorney, Agent, or Firm* — Harness, Dickey & Pierce, P.L.C.

(57) ABSTRACT

A semiconductor device includes a first semiconductor chip that is mounted face-down on a substrate, a second semiconductor chip that is mounted face-up on the first semiconductor chip, and a dummy chip that is interposed between the first semiconductor chip and the second semiconductor chip. The dummy chip is made from a homogenous material comprising silicon or an alloy containing an atomic percentage majority of silicon.

12 Claims, 1 Drawing Sheet

(56) References Cited

FOREIGN PATENT DOCUMENTS

| JP | 2005-017198 | 1/2005 |
| JP | 2005-026639 | 1/2005 |
| JP | 2005-129847 | 5/2005 |
| JP | 3681690 | 5/2005 |
| JP | 2005-303056 | 10/2005 |
| JP | 2006-060128 | 3/2006 |
| JP | 2006-173434 | 6/2006 |
| JP | 2006-173435 | 6/2006 |
| JP | 2006-229072 | 8/2006 |

* cited by examiner

THEE-DIMENSIONAL INTEGRATED SEMICONDUCTOR DEVICE AND METHOD FOR MANUFACTURING SAME

CROSS-REFERENCE TO RELATED APPLICATIONS

This application is a divisional of U.S. patent application Ser. No. 11/839,712 filed on Aug. 16, 2007. The disclosures of the above application is incorporated herein by reference.

BACKGROUND

1. Technical Field

The present invention relates to a semiconductor device which is particularly preferably applied to a three-dimensional integrated configuration.

2. Related Art

There has been a method in which a face-up mounted semiconductor chip is stacked on a face-down mounted semiconductor chip in a semiconductor device of related art in order to achieve high density packaging of the semiconductor chip.

For example, disclosed in an example of related art is a method for forming a conductor film on a rear surface of a second semiconductor chip mounted on a first semiconductor chip in order to restrain interference between the stacked semiconductor chips caused by noise.

Japanese Patent No. 3,681,690 is the example of related art.

However, in a stacked structure of the semiconductor chips of related art, the interference occurs between the stacked semiconductor chips caused by noise, disadvantageously leading to reduced reliability of the semiconductor device. Further, in the method disclosed in the example of related art, the conductor film needs to be formed on the rear surface of the second semiconductor chip mounted on the first semiconductor chip, disadvantageously leading to a complicated manufacturing process of the second semiconductor chip.

SUMMARY

The invention is intended to provide a semiconductor device in which chips can be stacked while suppressing the interference between the chips caused by noise, and a method for manufacturing the same.

According to a first aspect of the invention, a semiconductor device includes a first semiconductor chip that is face-down mounted on a substrate, a second semiconductor chip that is face-up mounted on the first semiconductor chip, and an electromagnetic shielding plate that is interposed between the first semiconductor chip and the second semiconductor chip.

In this case, even if the second semiconductor chip is stacked on the first semiconductor chip, it may be possible to suppress the interference between the first and second semiconductor chips caused by noise, without the complicated manufacturing process of the first and second semiconductor chips. Therefore, the cost may be prevented from increasing and packaging density of the semiconductor chip may be improved.

According to a second aspect of the invention, a semiconductor device includes a first semiconductor chip that is face-down mounted on a substrate, a second semiconductor chip that is face-up mounted on the first semiconductor chip, and a dummy chip that is interposed between the first semiconductor chip and the second semiconductor chip and having a conductor film formed on an upper or lower surface if the dummy chip.

In this case, since the dummy chip is interposed between the first semiconductor chip and the second semiconductor chip, suppressed may be the interference between the first and second semiconductor chips caused by noise. Thus, the packaging density of the semiconductor chip may be improved without leading to the complicated manufacturing process of the first and second semiconductor chips.

According to a third aspect of the invention, a semiconductor device includes a first semiconductor chip that is face-down mounted on a substrate, a second semiconductor chip that is face-up mounted on the first semiconductor chip, and an electronic component that is arranged below the second semiconductor chip and mounted on the substrate.

In this case, even if the second semiconductor chip is stacked on the first semiconductor chip, the second semiconductor chip and the electronic component may be arranged above the substrate to as to overlap each other, restraining increase of the packaging area.

According to a fourth aspect of the invention, a semiconductor device includes a first semiconductor chip that is face-down mounted on a substrate, a second semiconductor chip that is face-up mounted on the first semiconductor chip, an electronic component that is arranged below the second semiconductor chip and mounted on the substrate, and a spacer that is interposed between the first semiconductor chip and the second semiconductor chip, the spacer separating the second semiconductor chip from the electronic component.

In this case, even if the second semiconductor chip is stacked on the first semiconductor chip, the second semiconductor chip and the electronic component may be arranged above the substrate to as to overlap each other, restraining increase of the packaging area.

In the semiconductor device of the aspects of the invention, the second semiconductor chip preferably be larger than the first semiconductor chip.

In this case, the electronic component may be arranged below the second semiconductor chip while not contacting with the first semiconductor chip disposed beneath the second semiconductor chip. Thus, the packaging area may be increased.

In the semiconductor device of the aspects of the invention, the first semiconductor chip may have an analog IC and the second semiconductor chip may have a digital IC.

In this case, even if the analog IC and the digital IC are stacked on the same substrate, it may be possible suppress the interference between the analog IC and the digital IC caused by noise. This may suppress increase of the packaging area and reduce characteristic deterioration of the analog IC and the digital IC.

According to a fifth aspect of the invention, a method for manufacturing a semiconductor device includes face-down mounting a first semiconductor chip on a substrate, disposing on the first semiconductor chip a dummy chip having a conductor film formed on an upper or lower surface of the dummy chip, and face-up mounting a second semiconductor chip on the dummy chip.

In this case, since the dummy chip is mounted between the first semiconductor chip and the second semiconductor chip, it may be possible to suppress the interference between the first and second semiconductor chips caused by noise. Thus, the cost may be prevented from increasing, improving the packaging density of the semiconductor chip.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, description will be given of a semiconductor device according to an embodiment of the invention with reference to the drawings.

Figure 1A:
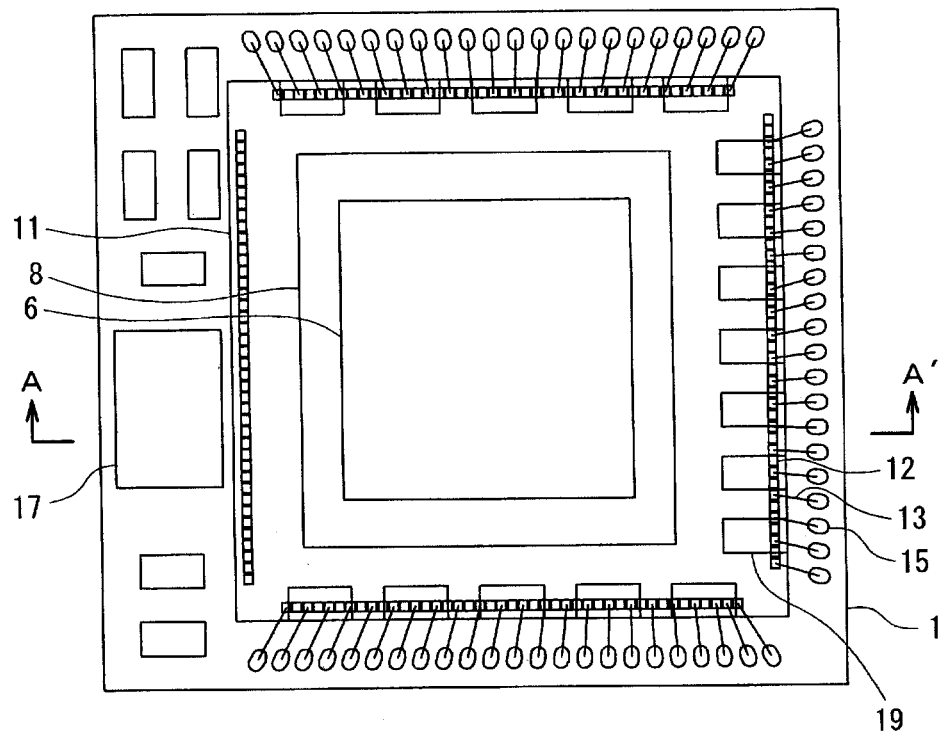
FIGS. 1(A) and 1(B) show a schematic configuration of an embodiment of the present invention.
Figure 1B:
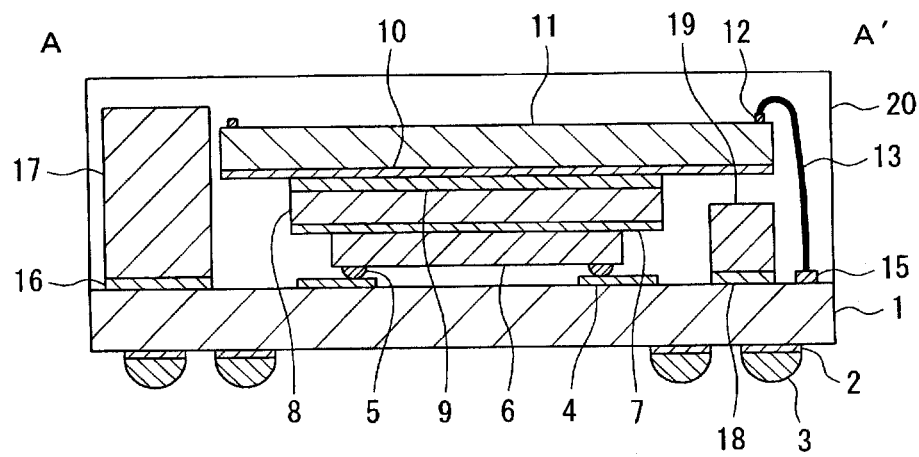

FIG. 1(A) is a plan view of a schematic configuration of the semiconductor device of the embodiment of the invention. FIG. 1(B) is a sectional view taken along line A-A' in FIG. 1(A).

Referring to FIGS. 1(A) and 1(B), a carrier substrate 1 has a land 2 formed on a rear surface thereof. The land 2 is formed thereon with a protruding electrode 3. The carrier substrate 1 has a surface thereof provided with a terminal electrode 4 coupled to a protruding electrode 5, a terminal electrode 15 connected with the bonding wire 13, and terminal electrodes 16 and 18 coupled respectively to electronic components 17 and 19. As the carrier substrate 1, used can be a double-sided substrate, multilayer wiring substrate, build-up substrate, tape substrate or film substrate, for example. The carrier substrate 1 uses as materials a polyamide resin, glass epoxy resin, BT resin, aramid/epoxy composites or ceramic. The protruding electrode 3 includes an Au bump, Cu bump and Ni bump coated with a solder or the like, or solder ball.

The protruding electrode 5 is formed on a semiconductor chip 6. A conductor film 9 is formed on an upper surface of a dummy chip 8. An electrode pad 12 is formed on a semiconductor chip 11. The semiconductor chip 6 can have an analog IC mounted thereon, and the semiconductor chip 11 can have a digital IC mounted thereon.

The dummy chip 8 can be formed of a bare chip composed of a semiconductor such as Si. The conductor film 9 can be made of a metal film such as Al and Cu, for example. A thickness of the conductor film 9 may be around 10000 Å. At this time, the conductor film 9 and the dummy chip 8 can be made as follows. First, a wafer composed of a semiconductor such as Si is prepared. The wafer may have such a size as to form a plurality of the dummy chips 8. Next, formed on one surface of the wafer entirely is a metal film such as Al and Cu, as the conductor film 9, by use of a sputtering method, chemical vapor deposition (CVD) method, and plating method. Finally, the wafer on which the conductor film 9 is made is cut into individual pieces of a size used as the dummy chip 8. Thus, the conductor film 9 and the dummy chip 8 are made. It should be noted that before the wafer is cut into individual pieces, a rear surface of the wafer (the surface of the wafer remote from that on which the conductor film 9 is formed) may be entirely provided with an adhesive layer 7 and then the wafer is cut into the individuals.

Alternatively, an electromagnetic shielding plate such as a metal plate or ferrite plate may be used instead of the dummy chip 8 provided with the conductor film 9.

The semiconductor chip 6 is face-up mounted on the carrier substrate 1 with the protruding electrode 5 therebetween. The protruding electrode 5 is coupled to the terminal electrode 4. In a case of coupling the protruding electrode 5 and the terminal electrode 4, used may be, for example, a metal connection such as solder connection and alloy connection, as well as a pressure welding connection such as anisotropic conductive film (ACF) connection, nonconductive film (NCF) connection, anisotropic conductive paste (ACP) connection, and nonconductive paste (NCP) connection.

On the semiconductor chip 6 disposed is the dummy chip 8 having on the upper surface thereof the conductor film 9 formed with the adhesive layer 7 interposed between the semiconductor chip and the dummy chip. The adhesive layer 7 and the dummy chip 8 may have the same size when viewed from the top. In other words, a configuration may be such that side surfaces of the adhesive layer 7 and the dummy chip 8 are identical.

On the conductor film 9, face-up mounted is the semiconductor chip 11 with an adhesive layer 10 therebetween. The adhesive layer 10 and the semiconductor chip 11 may have the same size when viewed from the top. In other words, a configuration may be such that side surfaces of the adhesive layer 10 and the semiconductor chip 10 are identical.

The semiconductor chip 11 is provided with the electrode pad 12 bonded to the terminal electrode 15 with the bonding wire 13, and is coupled to the carrier substrate 1 via the bonding wire 13. The electronic component 17 is mounted on the carrier substrate 1 with the terminal electrode 16 therebetween alongside the semiconductor chip 11. The electronic component 19 is mounted on the carrier substrate 1 with the terminal electrode 18 therebetween below the semiconductor chip 11. It should be noted that the electronic component 19 includes a resistor, capacitor, coil, and connector. The semiconductor chip 11 coupled with the bonding wire 13, and the electronic components 17 and 19 are sealed in a sealing resin 20.

With this configuration, in the case that the semiconductor chip 11 is disposed on the semiconductor chip 6, it is possible to restrain the interference between the semiconductor chips 6 and 11 caused by noise with no conductive layer formed on the rear surfaces of the semiconductor chips 6 and 11. As a result, the packaging density of the semiconductor chips 6 and 11 can be improved without requiring a complicated manufacturing process of the semiconductor chips 6 and 11.

It is preferable the semiconductor chips 6 and 11, and the dummy chip 8 are configured such that the sizes thereof are increased in the order of the semiconductor chip 6, the dummy chip 8, the semiconductor chip 11. That is, the configuration is preferably such that the dummy chip 8 is larger than the semiconductor chip 6, and the semiconductor chip 11 is larger than the dummy chip 8. This enables the electronic component 19 to be arranged below the semiconductor chip 11 without contacting with the semiconductor chip 6 and the dummy chip 8 disposed beneath the semiconductor chip 11, thus, suppressing the packaging area from increasing. A thickness of the dummy chip 8 can be set such that the electronic component 19 does not contact with the semiconductor chip 11. Specifically, the thickness of the dummy chip 8 and the conductor film 9 may be set such that the upper surface of the conductor film 9 (the surface of the conductor film 9 opposite to the surface of the conductor film facing the dummy chip 8) is higher than the upper surface of the electronic component 19 (the surface of the electronic component 19 opposite to the surface of the electronic component 19 facing the carrier substrate 1). This enables the electronic component 19 to be prevented from contacting with the semiconductor chip 11, and the dummy chip 8 to be used as a spacer. Therefore, the complicated manufacturing process can be suppressed and the electronic component 19 can be disposed below the semiconductor chip 11.

The carrier substrate 1 mounting thereon the semiconductor chips 6 and 11 can be applied to an electronic apparatus such as a liquid crystal display, mobile phone, handheld terminal, video camera, digital camera, mini disc (MD) player, IC card, and IC tag. Therefore, the electronic apparatus can be reduced in size and weight, and improved in reliability.

In the above-described embodiment, the method for mounting the semiconductor chip is described as an example. However, the invention is not necessarily limited to the mounting method of the semiconductor chip, and may be applied to a method for mounting a resistor, capacitor and connector, as well as a method for mounting a ceramic element such as a surface acoustic wave (SAW) element, an optical element such as an optical modulator and optical switch, and various sensors such as a magnetic sensor and biosensor,

What is claimed is:

1. A semiconductor device, comprising:
   a substrate;
   a first semiconductor chip that is mounted face-down on the substrate;
   a second semiconductor chip that is mounted face-up on the first semiconductor chip, the second semiconductor chip being larger than the first semiconductor chip, the second semiconductor chip being provided with electro pads bonded to terminal electrodes on the substrate with bonding wires;
   a dummy chip that is interposed between the first semiconductor chip and the second semiconductor chip, the dummy chip being made from a homogenous material comprising silicon or an alloy containing an atomic percentage majority of silicon;
   an electronic component arranged below and within an outer boundary of the second semiconductor chip in plan view, the electronic component being mounted on a first surface of the substrate, the electronic component being arranged entirely within an area defined by the bonding wire, a lower surface of the second semiconductor chip, a side end face of the first semiconductor chip, a side end face of the dummy chip, and the first surface of the substrate, the electronic component being a resistor, capacitor or coil; and
   an adhesive layer disposed on the lower surface of the second semiconductor chip, a first part of the adhesive layer being disposed between the second semiconductor chip and the dummy chip, a second part of the adhesive layer extends beyond the dummy chip such that it is spaced apart from and does not contact the dummy chip, the second part of the adhesive layer being disposed between the second semiconductor chip and the electronic component, the second part of the adhesive layer facing a first surface of the electronic component, the first surface of the electronic component being opposite to a second surface of the electronic component, the second surface of the electronic component facing the first surface of the substrate.

2. The semiconductor device according to claim 1, wherein a conductor film is formed on at least one of an upper surface and a lower surface of the dummy chip.

3. The semiconductor device according to claim 2, wherein the conductor film is formed on the upper surface of the dummy chip.

4. The semiconductor device according to claim 1, wherein the adhesive layer and the second semiconductor chip has a same size.

5. The semiconductor device according to claim 1, wherein the dummy chip is larger than the first semiconductor chip.

6. A semiconductor device, comprising:
   a substrate;
   a first terminal electrode that is provided on a first surface of the substrate;
   a second terminal electrode that is provided on the first surface of the substrate;
   a first semiconductor chip that is mounted on the substrate with a protruding electrode disposed between the first semiconductor chip and the substrate, a first surface of the first semiconductor chip on which the protruding electrode is formed facing the first surface of the substrate, the protruding electrode being coupled to the first terminal electrode;
   a second semiconductor chip that is mounted on the first semiconductor chip, a first surface of the second semiconductor chip facing the first surface of the substrate, the first surface of the second semiconductor chip being opposite to a second surface of the second semiconductor chip on which an electrode pad is formed, the electrode pad being bonded to the second terminal electrode with a bonding wire, the second semiconductor chip being larger than the first semiconductor chip, the second semiconductor chip being provided with electro pads bonded to terminal electrodes on the substrate with bonding wires;
   a dummy chip that is interposed between the first semiconductor chip and the second semiconductor chip, and the dummy chip being made from a homogenous material comprising silicon;
   an electronic component arranged between the first surface of the second semiconductor chip and the first surface of the substrate and arranged within an outer boundary of the second semiconductor chip in plan view, the electronic component being mounted on the first surface of the substrate, the electronic component being arranged entirely within an area defined by the bonding wire, the first surface of the second semiconductor chip, a side end face of the first semiconductor chip, a side end face of the dummy chip, and the first surface of the substrate, the electronic component being a resistor, capacitor or coil; and
   an adhesive layer disposed on the first surface of the second semiconductor chip, a first part of the adhesive layer being disposed between second semiconductor chip and the dummy chip, a second part of the adhesive layer extends beyond the dummy chip such that it is spaced apart from and does not contact the dummy chip, the second part of the adhesive layer being disposed between the second semiconductor chip and the electronic component, the second part of the adhesive layer facing a first surface of the electronic component, the first surface of the electronic component being opposite to a second surface of the electronic component, the second surface of the electronic component facing the first surface of the substrate.

7. The semiconductor device according to claim 6, wherein a conductor film is formed on at least one of a first surface of the dummy chip and a second surface of the dummy chip, the first surface of the dummy chip facing the second semiconductor chip, the second surface of the dummy chip facing the first semiconductor chip.

8. The semiconductor device according to claim 7, wherein the conductor film is formed on the first surface of the dummy chip.

9. The semiconductor device according to claim 6, wherein the adhesive layer and the second semiconductor chip has a same size.

10. The semiconductor device according to claim 6, wherein the dummy chip is larger than the first semiconductor chip.

11. The semiconductor device according to claim 1, wherein the adhesive layer extends to an outer edge of the first surface of the second semiconductor chip.

12. The semiconductor device according to claim 6, wherein the adhesive layer extends to an outer edge of the first surface of the second semiconductor chip.

* * * * *